United States Patent [19]
Blossfeld

[11] Patent Number: 5,504,361
[45] Date of Patent: Apr. 2, 1996

[54] POLARITY-REVERSAL PROTECTION FOR INTEGRATED ELECTRONIC CIRCUITS IN CMOS TECHNOLOGY

[75] Inventor: Lothar Blossfeld, Breitnau, Germany

[73] Assignee: Deutsche ITT Industries GmbH, Freiburg, Germany

[21] Appl. No.: 318,150

[22] Filed: Oct. 5, 1994

[30] Foreign Application Priority Data

Oct. 9, 1993 [DE] Germany ............... 43 34 515.8

[51] Int. Cl.⁶ ............... H01L 23/62; H01L 29/76; H01L 29/00
[52] U.S. Cl. ............... 257/355; 257/360; 257/363; 257/379; 257/546
[58] Field of Search ............... 257/355, 356, 257/357, 358, 359, 360, 361, 362, 363, 379, 369, 546, 536, 538

[56] References Cited

U.S. PATENT DOCUMENTS

| | | | |
|---|---|---|---|
| 3,411,200 | 11/1968 | Formigoni ............... | 257/536 |
| 4,616,243 | 10/1986 | Minato et al. ............... | 257/357 |
| 5,229,635 | 7/1993 | Bessolo et al. ............... | 257/360 |
| 5,326,994 | 4/1994 | Giebel et al. ............... | 257/357 |

FOREIGN PATENT DOCUMENTS

| | | | |
|---|---|---|---|
| 0246139A1 | 11/1987 | European Pat. Off. ............... | 257/355 |
| 0538507A1 | 4/1993 | European Pat. Off. ............... | 257/355 |
| 0573213A1 | 12/1993 | European Pat. Off. ............... | 257/355 |
| 53-136980 | 11/1978 | Japan ............... | 257/538 |
| 59-189675 | 10/1984 | Japan ............... | 257/363 |
| 3-295268 | 12/1991 | Japan ............... | 257/355 |

*Primary Examiner*—Steven H. Loke
*Attorney, Agent, or Firm*—Plevy & Associates

[57] ABSTRACT

A polarity-reversal protection device for integrated circuits, comprising a substrate of a first conductivity type; a well region of a second conductivity type opposite said first conductivity type, within said substrate; a field effect transistor having drain and source regions within said well of said first conductivity type, said drain region being connectable to external circuitry to be protected from polarity reversal of a supply voltage, said supply voltage being applied to said source region via a low impedance; and resistor means, coupled to said well region, for enabling said supply voltage to be applied therethrough to said well region, said resistor means operative to sink current during undesirable polarity reversal of the supply voltage, thereby preventing damage to the external circuitry and to the FET itself.

19 Claims, 1 Drawing Sheet

5,504,361

POLARITY-REVERSAL PROTECTION FOR INTEGRATED ELECTRONIC CIRCUITS IN CMOS TECHNOLOGY

FIELD OF THE INVENTION

The present invention relates to the provision of polarity-reversal protection for monolithic integrated electronic circuits implemented in CMOS technology, and particularly also for CMOS devices themselves.

BACKGROUND OF THE INVENTION

The protection of electronic circuit elements against polarity reversal, e.g., wrong connection to a battery, is of considerable importance, particularly in automotive electronics. In case of a reversal of supply voltage polarity, an entire integrated circuit may be destroyed, thus causing considerable damage. Circuits employing CMOS devices are particularly sensitive due to the sensitive nature of the thin insulated gates of the FETs.

To avoid the consequences of a polarity reversal, a diode is commonly incorporated within the integrated circuit to prevent reverse current flow which would otherwise damage the circuit. In CMOS circuits this has the disadvantage that a diode can only be integrated in connection with "buried-layer technology". This, however, involves additional technical complexity and thus entails increased expense, which should be avoided by all means.

Another problem with semiconductor devices, particularly with CMOS devices, is that they are prone to destruction from electrostratic discharge (ESD). It then becomes necessary to protect the operating circuit with ESD protection circuitry, which undesirably adds to overall circuit complexity and requires additional space.

U.S. Pat. No. 5,229,635 entitled "ESD Protection Circuit and Method for Power-Down Application" to Bessolo et al. discloses a circuit for providing ESD protection for an open-drain CMOS I/O buffer circuit. The protection circuit includes an NMOS transistor having its drain connected to the VDD power supply of the buffer circuit; and its bulk region connected to the VSS power bus. ESD protection is afforded by a parasitic lateral NPN bipolar transistor that is inherent in the NMOS transistor. However, polarity-reversal protection is not apparent with this circuit structure.

It is therefore an object of the present invention to provide polarity-reversal protection which can be achieved in conventional MOS technology without additional technical measures.

It is a further object of the present invention to provide a circuit that affords such polarity-reversal protection which simultaneously provides ESD protection with the same circuit structure.

SUMMARY OF THE INVENTION

The present invention is directed towards a polarity-reversal protection device for integrated circuits, comprising a substrate of a first conductivity type; a first well region of a second conductivity type opposite the first conductivity type within the substrate; a field effect transistor having drain and source regions of the first conductivity type within the first well, with the drain region being connectable to external circuitry, such as CMOS devices, to be protected from polarity reversal of a supply voltage, the supply voltage being applied to the source region via a low impedance; and resistor means, coupled to the first well region, for enabling the supply voltage to be applied therethrough to the first well region, the resistor means operative to sink current during undesirable polarity reversal of the supply voltage, thereby preventing damage to the external circuitry and to the field effect transistor itself.

Preferably, the resistor means consists of a second well region adjacent to the source region, and of the first conductivity type. A third well region of the second conductivity type may be employed adjacent to the second well region. A metal contact may then contact both the second and third well regions wherein the supply voltage is applied to the metal contact for application to the first well region.

The resistance of the resistor means is preferably chosen such that the structure also acts as an ESD protective structure without the need for additional space.

BRIEF DESCRIPTION OF THE DRAWINGS

For an illustration of exemplary embodiments of the present invention, reference is made to the following description, considered in conjunction with the accompanying drawings, in which.

DETAILED DESCRIPTION OF THE PREFERRED EMBODIMENT

Figure 1:
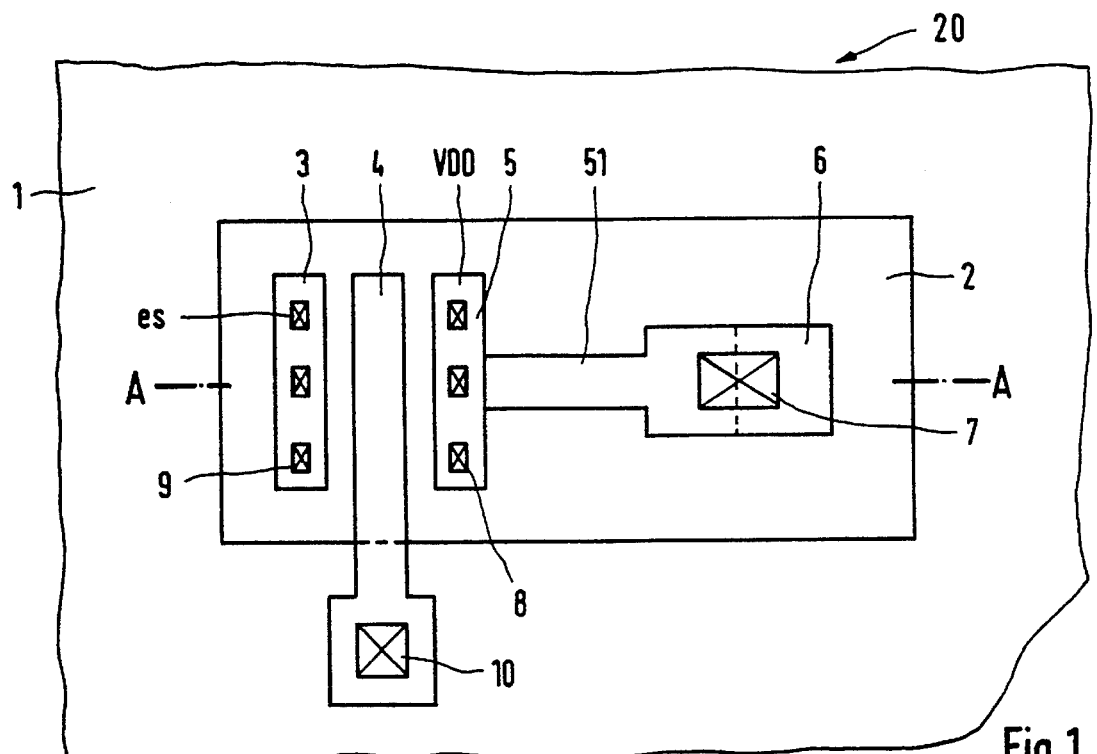
FIG. 1 is a plan view of the polarity-reversal-protection arrangement for a p-channel MOS transistor in accordance with the invention.
Figure 2:
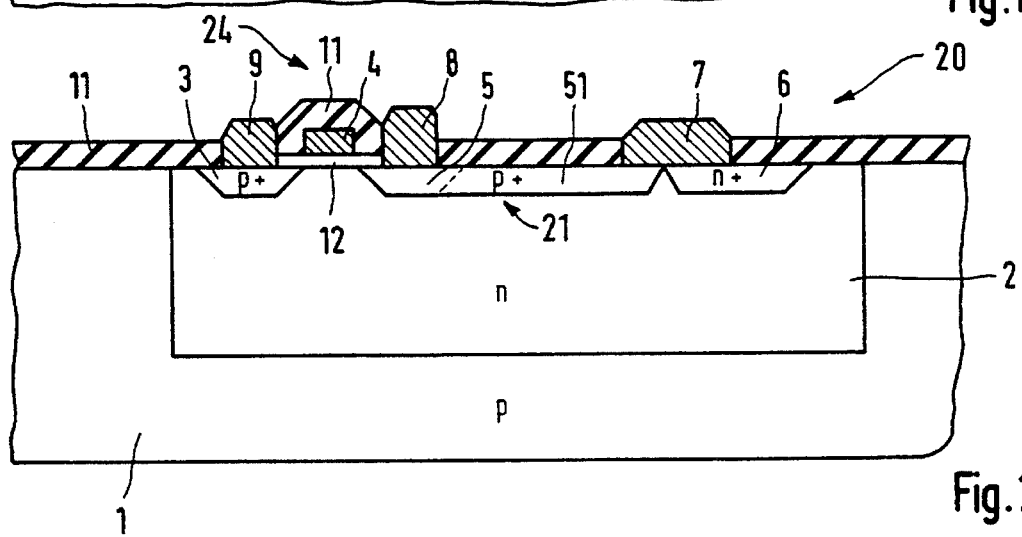
FIG. 2 is a cross sectional view taken along line A—A of FIG. 1.

Referring to FIGS. 1 and 2, a polarity-reversal protection circuit 20 according to the invention includes a p-channel MOSFET 24, typically of a CMOS FET pair. A substrate 1 is doped p type, as in the case in the most widely used form of CMOS technology. An n type well 2 has been formed into the surface of the substrate 1. Substrate 1 and well 2 are covered with an insulating layer 11 (omitted from FIG. 1) having contact openings for the underlying active regions. In the well 2, a drain region 3 and a source region 5 have been formed in a conventional manner, for example, by ion implantation into the well 2. Preferably, the source region 5 is formed as a portion of a larger well region 21. Region 21 includes a subregion 51 which acts as a resistor. The two regions 51 and 5 are adjacent with the dotted line denoting the separation between the regions. It should be understood that regions 51 and 5 need not be unitary as shown. Region 51 could alternatively be formed in the well 2 as an independent polysilicon stripe. Located between the source and drain regions 3, 5 is the gate electrode 4 of e.g., polysilicon. The subregion 51 extends to the $n^+$ type well portion 6. The reference numerals 7, 8, 9, and 10 designate the metal contacts at the respective regions. The source region 5 is connected to the positive supply voltage VDD through a low impedance, i.e., metal contact 8. Inputs to the circuit to be protected may be provided at the drain region 3.

The n type well 2 is formed into the p-type substrate 1 in a conventional manner. The surfaces of the substrate 1, the drain region 3, the source region 5, and the heavily doped well portion 6 are covered with insulating layer 11 of, e.g., silicon dioxide, leaving openings for the drain contact 9, the source contact 8, and the contact 7. Contact 7 connects the subregion 51 (which acts as a resistor) and the well portion 6. Disposed on the gate oxide 12 is the gate electrode 4, which is also covered by the insulating layer 11.

Figure 3:
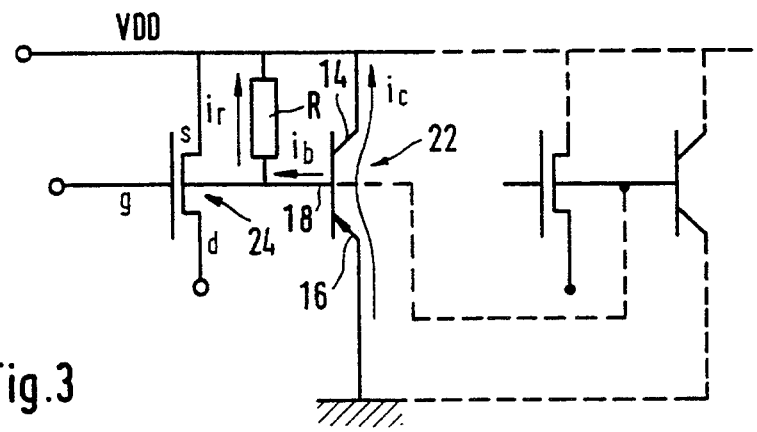
FIG. 3 shows the equivalent circuit of the arrangement of FIG. 1.

In the equivalent circuit shown in FIG. 3, the p-channel transistor 24 has its source-drain path connected between the supply voltage VDD and the circuit to be protected, which is coupled to the drain 3 (not shown). Connected between the supply voltage VDD and ground is the parasitic pnp transistor 22, which is formed by the source region 5 (=collector 14), the n type well 2 (=base 18), and the substrate 1 (=emitter 16). Connected between the base 18 (n-type well 2) and the supply voltage VDD is the resistor R, which consists of the region 51. Further parasitic transistors are indicated in FIG. 3 by broken lines.

The p-channel MOS transistor 24 shown in FIGS. 1 to 3 lies in an n type well 2 which is normally connected to the positive supply voltage VDD. As is well known in the art, such biasing of a "bulk substrate" as the well 2 is common in order to influence the threshold voltage of the FET. In the event of a polarity reversal of VDD, the n type well 2 forms, together with the substrate 1, a forward-biased diode which may draw such a large current that thermal destruction will take place. Since, during normal operation, only a very small current (<1 nA) flows through the n type well 2 in a MOS circuit (reverse direction), the well 2 can be connected through the resistor R (subregion 51) to the supply voltage VDD. The resistor R should be designed large enough to limit the current flowing through the well 2 in the event of a polarity reversal of VDD. When the polarity is reversed, the well current cannot flow directly via the contact 8 but must flow though the resistor R (as current $i_r$), which limits its value. A prerequisite is that the parasitic pnp transistor 22, consisting of the source region as the collector 14, the n type well 2 as the base 18, and the substrate 1 as the emitter 16, should have a sufficiently small current gain, and that the current flow ic, $i_r$ should be determined by the resistance of resistor R, not by the current gain of the transistor 22. This condition is fulfilled if the current gain B is less than unity (B <1). This requires that the ratio of the area of the source region, including the area of the additional resistor R, to the area of the n-type well should be less than 0.5.

The resistor R may also be an integrated, suitably dimensioned polysilicon stripe formed in the well. This stripe may be physically distinct from the source region 5, in which case only the area of the p type source region 5 (and not the area of the polysilicon stripe comprising the resistor R) enters into the area ratio to be taken into account.

Another problem with semiconductor devices is protection from electrostatic discharge, which also results in the device being destroyed. ESD-protected devices must also meet the above requirements. That is, the parasitic transistor 22 must have a current gain of less than unity, by restricting the source region 5 to well region 2 area ratio as above. The above-mentioned parasitic pnp transistor 22 then acts as an ESD protective structure. The shunt resistor R (i.e., region 51) which determines the turn-on current of the four layer device must have such a value that turn-on takes place far above the normal operating current.

To provide over-voltage protection, over-voltage protection elements, such as a zener diode, a thyristor, or a field-oxide transistor, whose switching threshold can be set by the field-oxide thickness, may be connected via the contact 7 of the well portion 6.

Thus, a significant advantage of the present invention is that it can be used to provide polarity-reversal protection and has a protective structure against electrostatic discharge without requiring additional area, since both structures can be quasi-inherent. This saving of area is of great importance. Still further space savings can be realized, since it is possible to connect two or more n-type well regions to the supply voltage through a single resistor. In this case, the current $i_r$ flowing through the resistor R can be substantially higher than the base current $i_b$ of the single parasitic transistor 22 because current from the other well regions adds to $i_r$.

To ensure a stabilized power supply, the gate of the p-channel transistor may be connected to a stabilized voltage which is lower than the supply voltage. It is also possible to connect the gate of the p-channel transistor to the negative supply voltage.

It should be understood that the embodiments described herein are merely exemplary and that a person skilled in the art may make many variations and modifications to the described embodiments utilizing functionally equivalent components to those described. For example, an n-channel FET structure could be employed instead of the p-channel FET structure described. All such variations and modifications are intended to be included within the spirit and scope of this invention as defined by the appended claims.

What is claimed is:

1. A polarity-reversal protection device for integrated circuits, comprising:

a substrate of a first conductivity type;

a first well region of a second conductivity type opposite said first conductivity type, within said substrate;

a field effect transistor (FET) having drain and source regions of said first conductivity type within said first well region, said drain region being connectable to external circuitry to be protected from polarity reversal of a supply voltage, said supply voltage being applied to said source region via a low impedance; and a resistor well region of said first conductivity type adjacent to said source region, coupled to said well region, for enabling said supply voltage to be applied therethrough to said well region, said resistor well region operative to sink current during undesirable polarity reversal of the supply voltage, for preventing damage to the external circuitry and to said FET.

2. The protection device according to claim 1, further comprising:

a second well region of said second conductivity type adjacent to said resistor well region, and having a doping concentration higher than the doping concentration of said first well region; and a metal contact having a first portion contacting said second well region and a second portion contacting said resistor well region.

3. The protection device according to claim 2, wherein said substrate is doped p type, said first well region is doped n type, said source, drain and resistor well regions are doped p+ type, and said second well region is doped n+ type.

4. The protection device according to claim 2 further including an over-voltage protection element coupled to said metal contact.

5. The protection device according to claim 1 wherein said source region and said resistor well region are unitary.

6. The protection device according to claim 5 wherein said unitary source and resistor well region occupy an area which is less than about one half of an area occupied by said well region.

7. The protection device according to claim 5 wherein said resistor well region is chosen such that a parasitic transistor simultaneously operates as an electrostatic discharge protective structure and a polarity-reversal protection structure.

8. The protection device according to claim 1 wherein said source region occupies an area less than about one half of an area occupied by said first well region.

9. The protection device according to claim 1 further comprising at least one other well region coupled to said resistor well region wherein said supply voltage supplies voltage to said at least one other well region through said resistor well region.

10. The protection device according to claim 1 wherein said substrate is coupled to a point of reference potential, and a parasitic bipolar transistor is formed having a collector region, a base region, and an emitter region; said source region forming said collector region, said well region forming said base region, said substrate forming said emitter region, and said resistor well region being coupled between said base region and said collector region, wherein said resistor well region minimizes current flow through said parasitic transistor during polarity reversal of the supply voltage.

11. The protection device according to claim 10 wherein said parasitic transistor has a current gain of less than about unity.

12. The protection device according to claim 1, wherein said external circuitry comprises CMOS devices.

13. The protection device according to claim 1 wherein said resistor well region comprises a polysilicon stripe formed in said first well region.

14. The protection device according to claim 1 wherein a stabilized voltage lower than the supply voltage is applied to a gate of said FET, for insuring a stabilized power supply.

15. A polarity-reversal protection device for integrated circuits, comprising:

- a substrate of a first conductivity type having a major surface, said substrate being coupled to a point of reference potential;
- a first well region of a second conductivity type opposite said first conductivity type, formed from said major surface within said substrate;
- a field effect transistor (FET) having drain and source regions of said first conductivity type within said first well region, said drain region being connectable to external circuitry to be protected from polarity reversal of a supply voltage, said supply voltage being applied to said source region via a low impedance;
- a second well region of said first conductivity type within said first well region, unitary with said source region wherein said unitary source and second well region occupy an area less than about one half of an area occupied by said first well region;
- a third well region of said second conductivity type formed from said major surface within said first well region, adjacent to said second well region;
- a metal contact on said major surface having a first portion contacting said second well region and a second portion contacting said third well region;
- wherein said second well region functions as a resistor which sinks current during undesirable polarity reversal of the supply voltage, for preventing damage to the external circuitry and to said FET.

16. The protection device according to claim 15 wherein a parasitic bipolar transistor is formed having a collector region, a base region, and an emitter region; said source region forming said collector region, said first well region forming said base region, said substrate forming said emitter region, and said second well region being coupled between said base region and said collector region, wherein said second well region minimizes current flow through said parasitic transistor during polarity reversal of the supply voltage.

17. The protection device according to claim 16 wherein said parasitic transistor has a current gain of less than about unity.

18. The protection device according to claim 17, wherein said external circuitry comprises CMOS devices.

19. The protection device according to claim 18, wherein said substrate is doped p type, said first well region is doped n type, said source, drain and second well regions are doped p+ type, and said third well region is doped n+ type.

* * * * *